United States Patent
Young et al.

(10) Patent No.: US 6,953,324 B1
(45) Date of Patent: Oct. 11, 2005

(54) ADJUSTABLE CRANKPIN THROW STRUCTURE HAVING IMPROVED THROW STABILIZATION MEANS

(75) Inventors: Michael R. Young, Bristol, TN (US);
Joseph F. Loprete, Bristol, TN (US);
David T. Monk, Lebanon, VA (US);
Philip C. Wagner, Bristol, TN (US);
Joe T. Hill, Bristol, VA (US); Robert B. Peters, Bristol, VA (US)

(73) Assignee: Bristol Compressors, Inc., Bristol, VA (US)

( * ) Notice: Subject to any disclaimer, the term of this patent is extended or adjusted under 35 U.S.C. 154(b) by 389 days.

(21) Appl. No.: 09/584,183

(22) Filed: May 31, 2000

Related U.S. Application Data

(63) Continuation of application No. 08/911,481, filed on Aug. 14, 1997, now Pat. No. 6,092,993.

(51) Int. Cl.$^7$ .............................................. F04B 19/00
(52) U.S. Cl. ...................................... 417/211; 417/315
(58) Field of Search ................................. 417/221, 315

Primary Examiner—Charles G. Freay
(74) Attorney, Agent, or Firm—Finnegan, Henderson, Farabow, Garrett & Dunner LLP

(57) ABSTRACT

A stabilizing structure for a throw adjusting eccentric cam in a two-stage reciprocating compressor is provided. The compressor includes a block that has at least one cylinder with an associated compression chamber and piston, a crankshaft that includes an eccentric crankpin, and a reversible motor for rotating the crankshaft in a forward and a reverse direction. An eccentric, two position cam is rotatably mounted over the crankpin. The cam rotates to and operates at a first position relative to said crankpin when the motor is running in the forward direction and rotates to and operates at a second position relative to said crankpin when the motor is running in the reverse direction. The combined eccentricities of the crankpin and the cam cause the piston to have a first stroke when the motor operates in the forward direction and a second stroke when the motor operates in the reverse direction. There is also provided a control for selectively operating the motor either in the forward direction or in the reverse direction.

11 Claims, 18 Drawing Sheets

ADJUSTABLE CRANKPIN THROW STRUCTURE HAVING IMPROVED THROW STABILIZATION MEANS

This is a continuation of application Ser. No. 08/911,481, filed Aug. 14, 1997 now U.S. Pat. No. 6,092,993, all of which are incorporated herein by reference.

BACKGROUND OF THE INVENTION

1. Field

The present invention is concerned with switching the stroke length of one or more reciprocating pistons of machines including reciprocating gas compressors and vacuum or other pumps and other devices including scotch yoke compressors such as shown in U.S. Pat. No. 4,838,769, in which the reciprocating motion of the pistons is effected by the orbiting of crankpins which are attached to said pistons by connecting rods or other connecting structures having bearings rotatably mounted on said crankpins.

In particular, the invention concerns gas compressors, especially multi-cylinder refrigerant compressors, in which the connecting rod bearing of at least one piston is mounted on an eccentric cam rotatably mounted on the crankpin. This cam is angularly adjustable by reversal of the crankshaft drive motor and thus the crankshaft rotation to switch to either a lengthened or shortened crankpin throw and piston stroke, depending, by design, on the direction of rotation of the crankshaft. Such stroke or throw switching can be engineered to give desired high pressure refrigerant output capacities such that the compressor efficiency can be maintained more easily under markedly varying load requirements.

Another and preferred aspect of the invention concerns a unique electrical circuitry for operating the crankshaft drive motor, whereby reversal of the motor for reducing or eliminating the throw takes the motor off the normal run winding and places it on a more efficient winding of reduced current capacity, in particular, the start winding.

2. Prior Art

Throw switching structures for which the present invention finds particular application are shown and described in U.S. Pat. Nos. 4,479,419; 4,236,874; 4,494,447; 4,245,966; and 4,248,053, the disclosures of which with respect to general compressor construction and also with respect to particular structures of cylinder, piston, crankshaft, crankpin and throw shifting mechanisms are hereby incorporated herein by reference in their entirety. With respect to these patents the crankpin journal is complex and comprised of an inner and one or more outer eccentrically configured journals, said inner journal being the outer face of the crankpin shaft, and the outer journal(s) being termed "eccentric cams or rings" in these patents, and being rotatably mounted or stacked on said inner journal. The bearing of the connecting rod is rotatably mounted on the outer face of the outermost journal.

In these patents, as in the present invention, all journal and bearing surfaces of the power transmission train of the shiftable throw piston from the crankshaft to the connecting rod are conventionally circular and allow structurally unhindered rotative motion, within design limits, of the outer journal(s) on the inner journal and of the connecting rod bearing on the outermost journal. This rotative motion, in either direction, will, thru the eccentricity of the outer journal surface of the outermost journal relative to its inner bearing surface, shift the radial distance of the orbital axis of the crankpin from the axis of rotation of the crankshaft and thus change the throw of the crankpin and the stroke of the piston. The present invention will be described below in reference to a single cam mounted on a crankpin shaft.

As described in, e.g., said U.S. Pat. No. 4,479,419 and with reference to the structure numbering therein, the angular positioning of the cam 38 on the crankpin 34 is accomplished by providing a pair of drive stops (not numbered in the said 4,479,419 patent, but numbered 58, 60 in the 4,494,447 patent as "end points") which are angularly spaced on a portion of the crankshaft such as the crankpin 34, and a driven dog 48 provided on the cam 38. These stops and the dog are angularly positioned with respect to each other such that upon rotation of the crankshaft in one direction one of the stops will first engage one side of the dog and rotate cam 38 to a first prescribed angular position on the crankpin to produce one piston stroke length. Conversely, reversing the rotation of the crankshaft will terminate this first engagement and cause the other of the stops to rotate to and engage an opposite side of the dog and rotate the cam to a second prescribed angular position on the crankpin to produce another piston stroke length. These angular positions are alternatively characterized herein as "end point(s)" or "dog-stop" junction(s) or "contact junction (s)", all hereinafter termed "junction(s)".

It is noted that at least a portion of the rotation of the cam relative to the crankpin to either of its endpoints can also result from the inertia of the cam or the rotational drag of the strap end bearing of the connecting rod acting on the outer journal surface of the cam.

It is apparent that for a given fixed crankpin throw the maximum possible magnitude of the piston stroke shift will depend on the degree of eccentricity between inner bearing surface and the outer journal surface of the cam. A larger eccentricity will allow an increased or reduced throw depending on the angular position of the cam on the crankpin. Therefore, a properly configured eccentricity will allow the said orbital axis of the crankpin to become coincident with the axis of the crankshaft, thus bringing the crankpin throw and the piston stroke to zero, and thus pacifying the throw, piston and cylinder. It is noted that in this zero stroke or passive mode, the completely pacified piston will remain, theoretically, one half way between its normal top dead center and normal bottom dead center positions during further operation of the compressor in the reduced capacity mode.

It is to be particularly noted, that as mentioned above, all of the journals and bearings involved in this power transmission train are essentially perfectly circular within, of course, modern machining capability, and their rotational contacts with one another are practically frictionless. Thus arises the conundrum that if only one side of the dog is in engagement with a stop at any given time, what is to prevent disengagement of the junction and the consequent rotation of the cam on the crankpin during periods when the cam is being driven by the stop with only minimal force? Such a disengagement would produce a plethora of unplanned piston strokes, which of course would significantly thwart the effort to maintain maximum compressor efficiency under varying load requirements. The apparent answer is that the junction can be maintained simply by the inertia of the cam during such periods.

Applicants extensive experimentation however, with such complex crankpin journals under typical compressor operating conditions has confirmed that such cam inertia is essentially ineffective to prevent disengagement, i.e., instability of the junction and the throw shift under the dynamic forces present, even in a theoretically completely pacified cylinder.

Taking, for example, the particular case wherein the cam has been rotated on the crankpin to produce a zero piston stroke, any significant "incidental" pressure above ambient, i.e. above the low pressure side of the compressor, developed in the pacified compression chamber by, e.g., high pressure gas leakage across the discharge valve, will act on the piston and connecting rod and cause the cam to rotate on the crankpin at least within the first quadrant (see FIG. 3) and disengage the junction. Such disengagement can range rapidly from barely detectable to several degrees and result in the generation of unwanted piston strokes of various lengths. Also, a further and quite severe problem resulting from such disengagement which our investigations have revealed is that of the generation of considerable metallic clacking or clicking noise generated by the rapid and forceful reengagement of the stop and dog, particularly in the second quadrant, as the disengagement angle declines to zero with a drop in said incidental pressure towards or even below ambient.

Further, taking the case where a previously completely pacified piston has become fully stroked by reversal of the crankshaft rotation, incidental pressure applied to the piston on the inception of its suction stroke by way of compressed gas which was not discharged on the compression stroke, i.e., reexpansion gas, will tend to cause an essentially immediate disengagement of the junction in the first quadrant. This disengagement can then be continued and perhaps amplified in the second quadrant as the linear velocity of the crankpin declines for the bottom dead center turn while the linear inertia of the combined masses of the piston and connecting rod maintains a rotating force on the cam and tends to advance it and the dog further beyond the stop. Under such conditions, the eventual reengagement of the stop and dog in a late section of the second quadrant is with substantial momentum and impact.

Still another major contributor to junction instability is that immediately upon completion of the bottom dead center turn of the crankpin, the diminished pressure existing in the compression chamber will allow the ambient pressure rapidly force the piston further into the cylinder and thereby rotate the cam in advance of the stop and cause a substantial degree of disengagement. Then, as the pressure in the compression chamber rapidly increases on the compression stroke, the linear velocity of the piston rapidly declines relative to the orbital velocity of the crankpin and the stop catches up with and impacts against the dog, with considerable force and noise.

Referring to the aforementioned patents, only the 4,494,447 patent even alludes to any destabilizing phenomena, and then only with a glancing mention in column one that gas thrust, piston rod inertia, and centrifugal and gas torque reversal forces contribute to cam instability. In what context and in what relationship however, to, e.g., a zero stroke piston mode is not readily apparent from this patent. Also, in column one of that patent it is stated that "—forces which generally tend to prevent the possibility of oscillation are friction forces, various drag loads, and cam inertia forces." This statement appears to be a recitation of those forces which are inherently present, in varying degrees, in all refrigeration compressors, and sheds no light on a solution to the instability problem, particularly with respect to a zero piston stroke mode.

This patent then goes on to disclose an actual stabilizing structure constituting its invention, which structure is characterized as aiding in holding the cam in the desired position. This structure comprises end stops 58, 60 which are preferably spaced about 270° apart such that a substantial centrifugal force torque "CFT" will develop tending to maintain the stops and dog in contact at the endpoints of the cam rotation, as shown in FIGS. 4 and 5 of the patent.

Also as disclosed in this patent, this CFT can be generated by repositioning the center of mass 62 of the cam away from the throw axis which passes thru the crankshaft axis 30a and the crankpin axis 32a, as shown in FIGS. 6 and 7 of the patent. It is particularly noted that the stabilizing structure of this patent is not intended to, nor can it function to provide a zero stroke piston mode. Further, it has been Applicants' experience that even where a reduced stroke is to be provided, a CFT solution is inadequate to prevent junction destabilization and unacceptable noise in conventional compressor operations. Obviously, as used herein, the CFT generated by this patent and by the present structure is a CFT which tends to make, rather than break the junction(s).

OBJECTS OF THE INVENTION

Objects therefore of the present invention therefore, are: to provide a crankpin throw shifting structure for at least one crankpin of a multicylinder compressor, which structure does not respond to destabilizing forces developed during either the passive or active mode of the piston operation and which thereby eliminates noise which otherwise would be generated by repeated remakings of the stop-dog junction during operations in either of said modes; to provide said stabilizing structure whereby in the passive mode the piston has essentially zero piston stroke; to provide such stabilizing structure which requires little alteration of existing compressors of the type herein concerned; and to provide a markedly more efficient drive motor reversing means for compressor operations alternating between full capacity and reduced capacity.

SUMMARY OF THE INVENTION

The above and other objects hereinafter becoming evident have been attained in accordance with the present invention thru the discovery of stabilizing structure for throw adjusting eccentric cams such as are disclosed in the compressors described in the aforecited patents, particularly in the 4,479,419 patent, wherein the mechanism for positioning the cam at opposite end points comprises cooperating drive stop means on the crankshaft and driven dog means on the cam, wherein said stabilizing structure comprises at least one of (A) positive lock means selected from the group consisting of
  (a) latching means having cooperating elements on said crankshaft and cam, said elements being engageable and disengageable at least at one of said end points by the application of or the release of, respectively, centrifugal force applied to an element of said latching means, or
  (b) pressure differential operable means having cooperating elements on said crankshaft and cam, said elements being engageable and disengageable by sudden and opposite angular motion respectively between said crankpin shaft and cam at least at one of said end points;
(B) friction drag means having operating elements on said cam and said crankshaft and being engageable to resist destabilizing forces tending to rotate said cam on said crankpin shaft and thus separating said junction at least at one of said endpoints; or
(C) pressure regulating means which functions to minimize any differential in pressure between the low side of the compressor and the compression chamber of a pacified cylinder.

It is noted that for certain compressor operating conditions it may not be considered necessary to provide a stabilizing structure for each of the junctions, i.e., at both of said endpoints, although providing at least one of said structures for each end point is highly preferred.

BRIEF DESCRIPTION OF THE DRAWINGS

The invention will be further understood from the drawings herein of certain preferred embodiments and the description thereof, wherein.

DETAILED DESCRIPTION OF THE DRAWINGS

Figure 1:
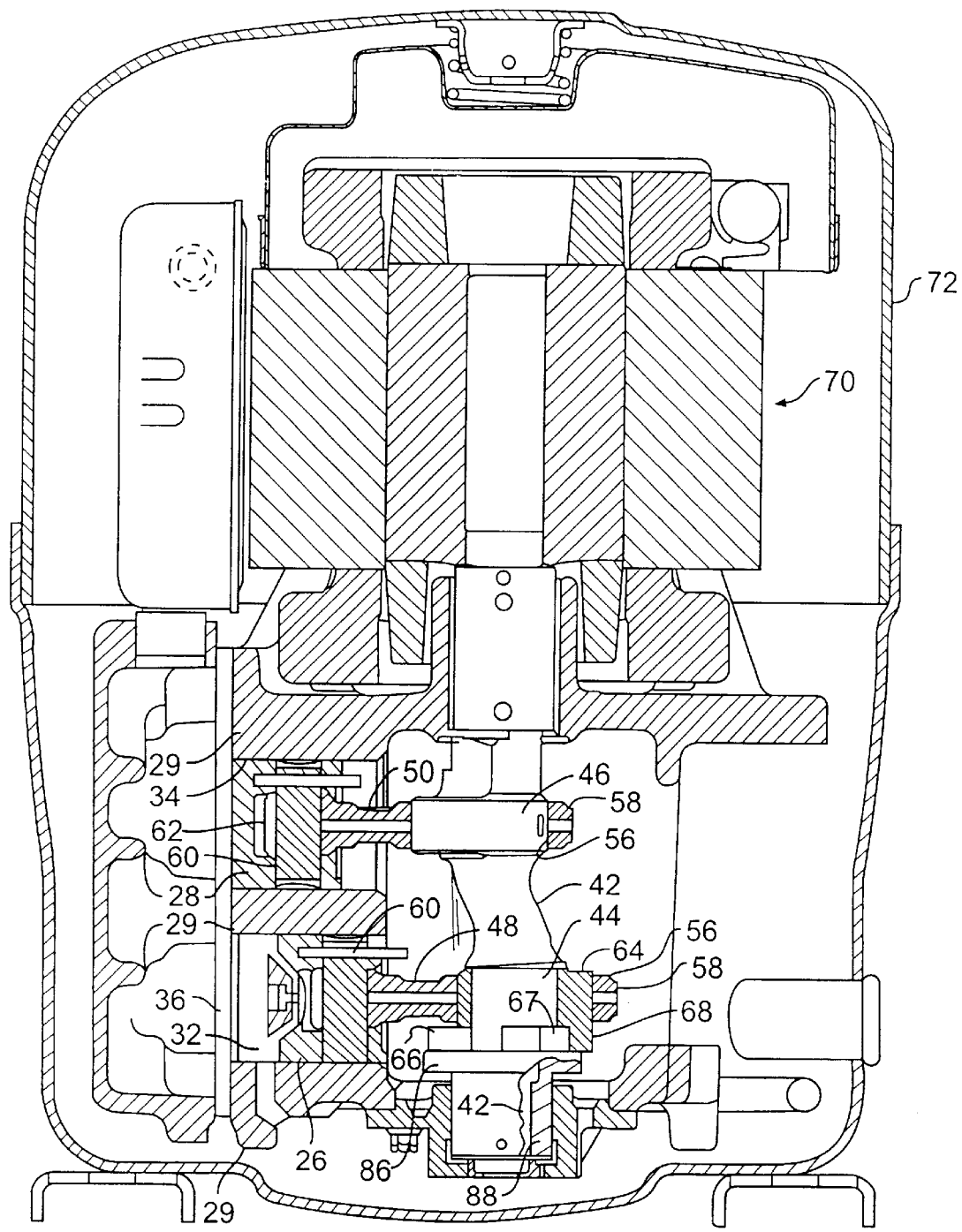
FIG. 1 is a longitudinal, vertical cross-sectional view of a refrigerant compressor with portions shown in relief for purposes of clarity, and with its bottom crankpin throw modified with an eccentric cam in accordance with the present invention, with the cam shown in its active mode orientation, i.e., full throw of the crankpin, and with the associated piston having a pressure deformable suction valve structure in the piston head, whereby said structure provides for pressure let-down from the compression chamber.
Figure 2:
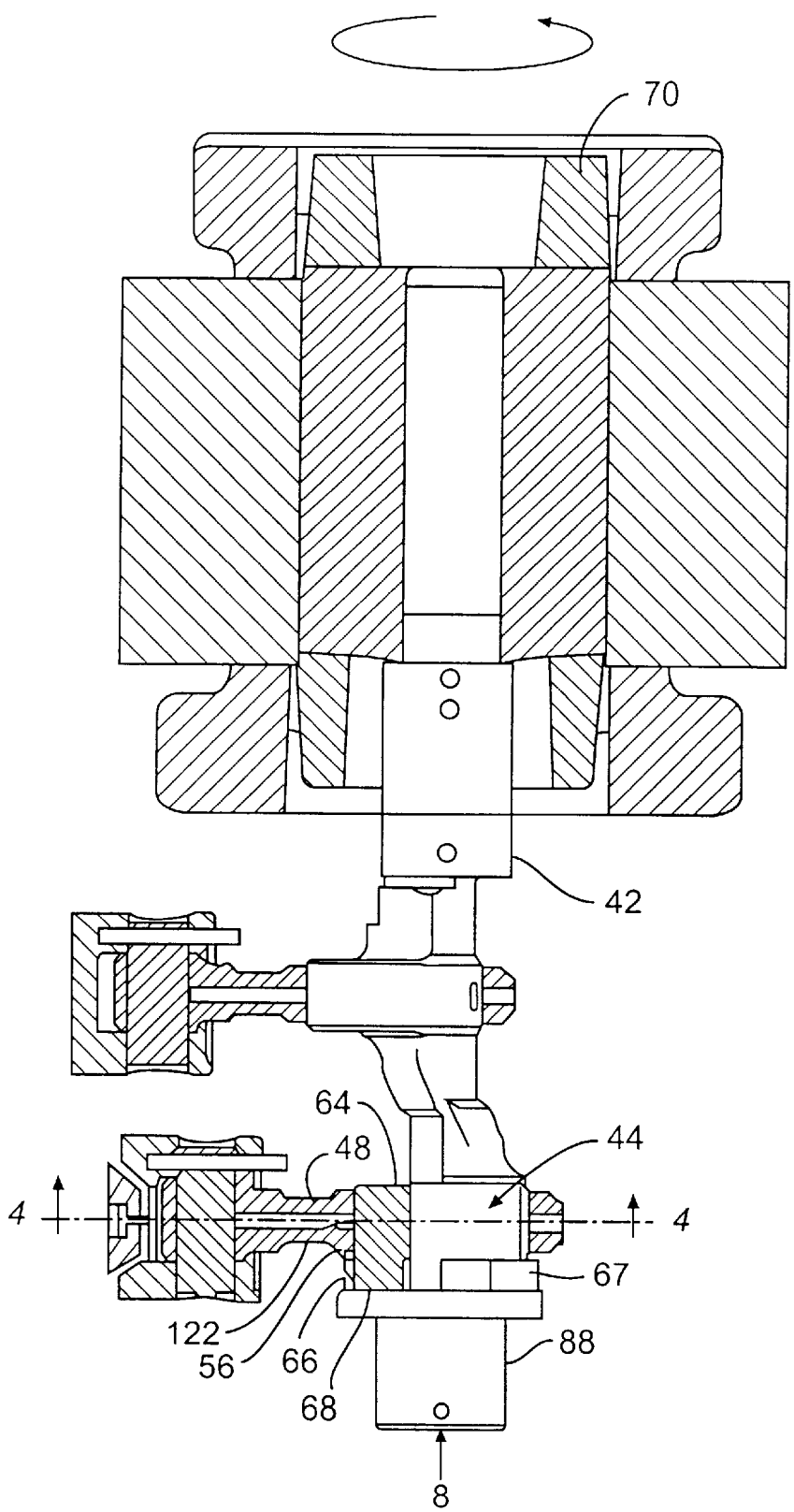
FIG. 2 is a cross-sectional view of the bottom piston and crankshaft throw area as in FIG. 1 and showing the cam in its passive mode orientation wherein the apex of the cam is proximal to its associated piston, i.e., producing a zero crankpin throw.

With reference to the drawings and the claims hereof, the present variable capacity gas compressor as shown in one particular embodiment as having dual in-line pistons 26, 28 is comprised of cylinder block means 29 formed with cylinders 32, 34 in which pistons 26, 28 respectively are reciprocably mounted, and having a valve plate 36 in which suction valve means 38 and discharge valve means 40 typically are provided. It is noted however, that where the suction valve is mounted in the piston head as in U.S. Pat. Nos. 5,080,130; 5,106,278; and 5,203,857, the disclosures of which are hereby incorporated herein by reference in their entirety, no suction valve is needed in the valve plate.

A crankshaft 42 is rotatably mounted on said block means and is provided with crankpin shafts or eccentrics 44, 46. Connecting rods 48, 50 are each provided with a bearing 56 on one end portion 58, and with a wrist pin 60 on its other end portion 62. An eccentric cam 64 is rotatably mounted on at least one of said crankpins, and one of said bearings 56 is rotatably mounted on said cam. In one embodiment, as shown in FIG. 4 to drive stop 66 and 67 are provided on said crankshaft at predesigned angular positions thereon, and one driven dog 68 is provided on said cam at a predesigned angular position thereon.

It is noted that either two stops can be provided with one dog positioned therebetween, or two dogs can be provided with one stop positioned therebetween. Either way the stop(s) and dog(s) define the angular limits or end points of rotatability of the cam on the crankpin.

A reversible motor 70 within the compressor shell 72 drives the crankshaft selectively in either rotational direction in accordance with operational electrical signals transmitted thereto, and the cam is responsively rotatable to one said end point upon rotation of said crankshaft in one direction and to the other end point upon rotation of said crankshaft in the reverse direction, at which end points the stop(s) and dog(s) form the junction(s).

Figure 4:
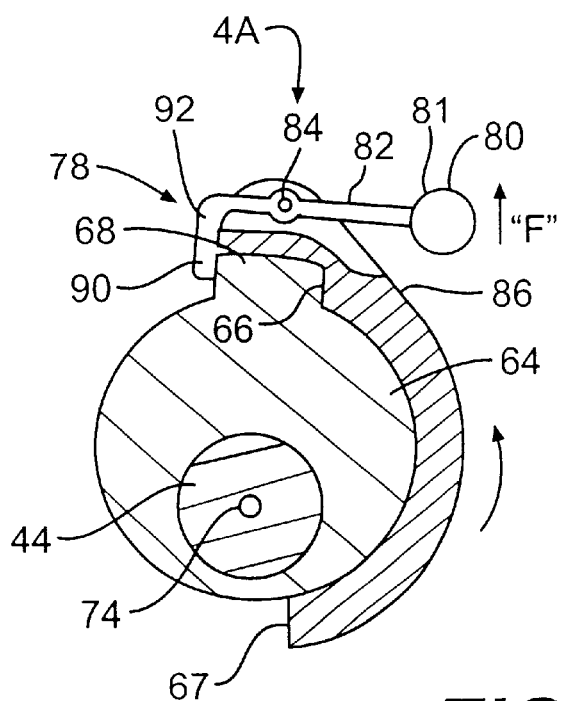
FIG. 4 is a cross-sectional view taken along line 4—4 of FIG. 2 showing a centrifugal force operable latching mechanism.
Figure 5:
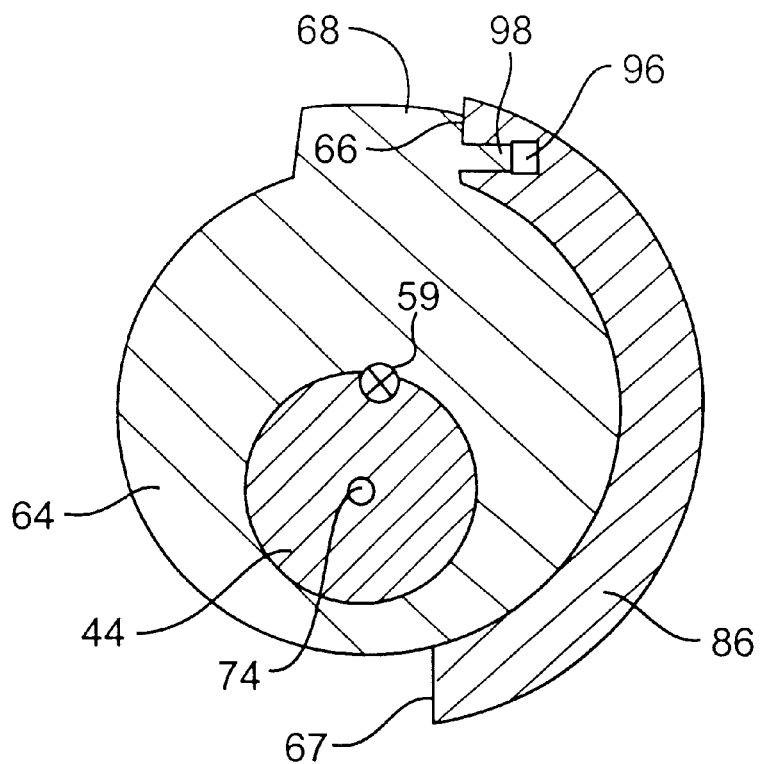
FIG. 5 is a cross-sectional view showing a pressure differential operated stabilizing structure.
Figure 6:
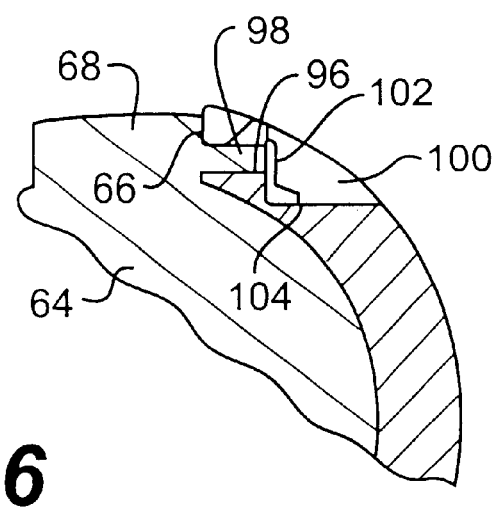
FIG. 6 is a view showing a variation of the structure of FIG. 5.

The present stabilizing means designated above as being at least one of (A), (B) or (C) are further and more specifically explained with reference to the drawings wherein FIGS. 4–6 show exemplary embodiments of (A), FIGS. 7–11 show exemplary embodiments of (B), and FIGS. 12–21 show exemplary embodiments of (C).

Figure 3:
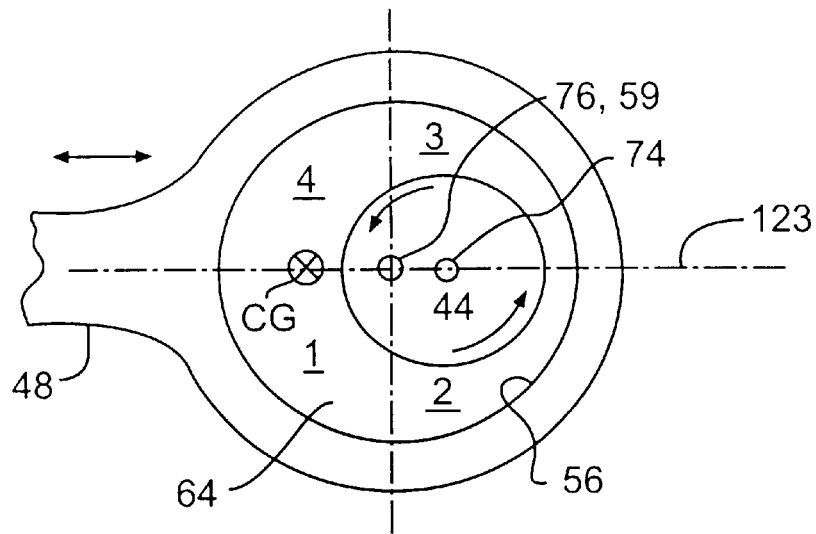
FIG. 3 is a geometric illustration of the passive throw cycle with reference to the structure of FIG. 2, taken in a counterclockwise crankshaft rotation in FIG. 2 as viewed from the bottom of the crankshaft along line 8, with the quadrants of the cycle numbered progressively 1–4 and with the piston at its passive position as in FIG. 2.

Referring to FIG. 3, the cam 64 is shown in its pacifying orientation wherein the center axis 74 of the crankpin shaft 44 has been translated to the rotational axis 76 of the crankshaft and the center or rotational axis 59 of the cam whereby the orbital axis of the crankpin has become aligned with the rotational axis of the crankshaft. This translation has, in effect, reconfigured the crankpin to be concentric with the crankshaft, the reformed crankpin now constituting the total mass and shape of the original crankpin shaft plus that of the cam. As seen in FIG. 3, each revolution or orbit of the crankpin is quartered into four quadrants 4—4, for purposes of clarity in regard to the aforementioned destabilizing forces and the stabilizing structures detailed below.

Figure 4A:
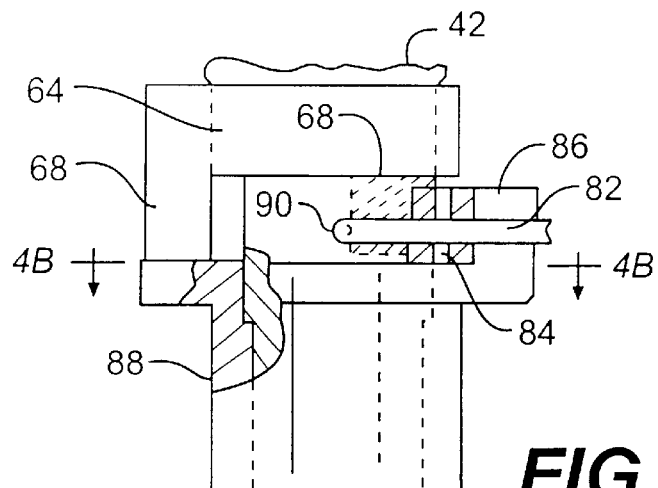
FIG. 4A is a view of the mechanism of FIG. 4 as viewed from the top side in the direction of line 4A.
Figure 4B:
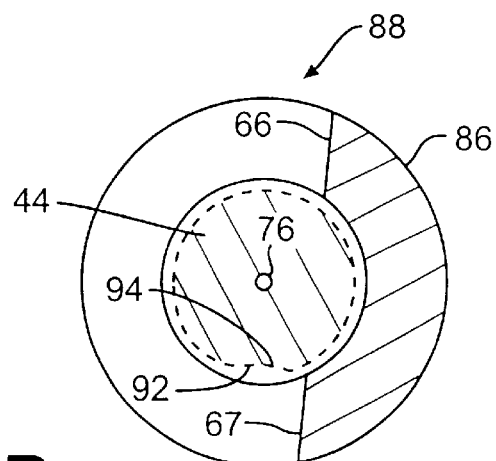
FIG. 4B is a view taken along line 4B—4B of FIG. 4A.

Referring to FIGS. 4, 4A and 4B, a preferred structure for the latching means generally designated 78 comprises a mass 80, e.g., 5–10 ounces or so, on the distal end 81 of a lever 82 which is pivotally connected by a pivot pin 84 to a portion of the crankshaft such as, e.g., skirt portion 86 of a bushing 88, which portion carries the dog or dogs. A hook member 90 is formed on the proximal end of the lever and engages the dog 68 as the dog engages stop 66, in response to upward centrifugal force "F" (as viewed in FIG. 4) on mass 80 developed by the rotating crankshaft.

It is noted that as the crankshaft slows down to reverse its rotation, the weight of mass 80 will overcome the centrifugal latching force "F" and pivot member 90 out of engagement with dog 68 to allow rotation of the cam to its other end point at stop 67. This delatching will occur most easily when the crankshaft, cam and lever structure as shown in FIG. 4 are in substantially their vertical orientation as shown in FIG. 4.

An identical device 78 may be mounted on the bushing skirt 86 adjacent stop 67 to maintain the dog 68 stop 67 junction in the same manner as described above. Bushing 88 is keyed to the crankshaft by cooperating flats 92 and 94 on the crankshaft and the bushing 88 respectively. Keys and keyways may of course be employed alternatively for this purpose.

Figure 4C:
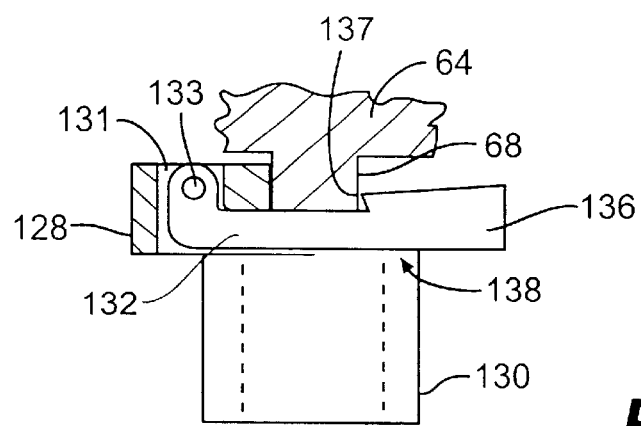
FIG. 4C is a side view of a preferred construction and configuration of the type of stabilizing means of FIG. 4 in its latching or running mode.
Figure 4D:
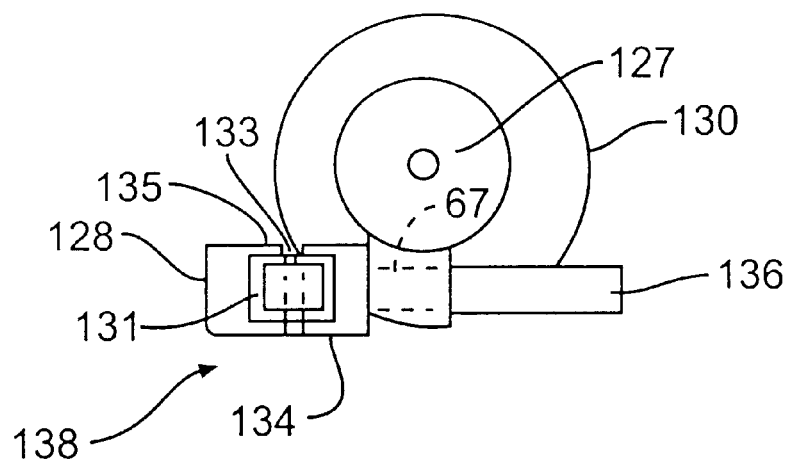
FIG. 4D is a top view of the stabilizing means of FIG. 4C.
Figure 4E:
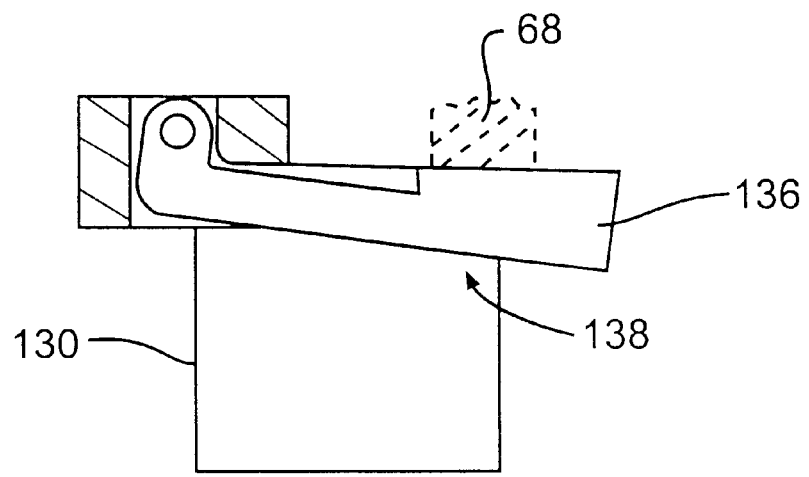
FIG. 4E is a side view of the stabilizing means of FIG. 4C in its unlatched or stopped mode.
Figure 25:
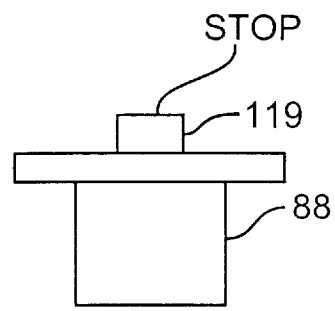
FIG. 25 is a side view of a single dog bushing for use with the cam of FIG. 22.
Figure 26:
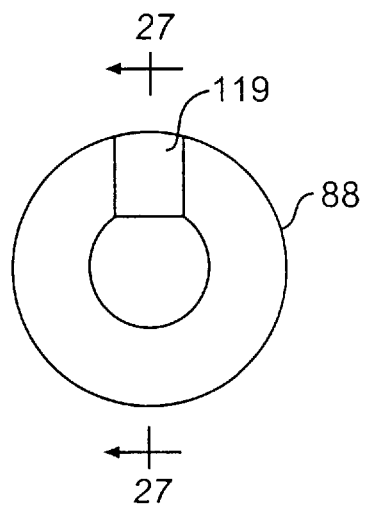
FIG. 26 is a top view of the bushing of FIG. 25.
Figure 27:
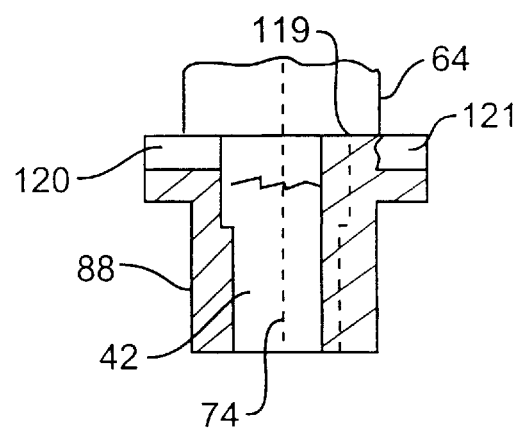
FIG. 27 is a partially cross-sectional view taken along line 27—27 of FIG. 26, an assembly of the cam of FIG. 22 and the bushing of FIG. 25 onto the lower end of the crankshaft.

Referring to FIGS. 4C, 4D and 4E, the modification of bushing 88 as shown as 130 in FIGS. 4C–4E is rotated 180° on its bore axis 127 from 88 of FIGS. 25–27, and is provided at its upper end with a stabilizing means 138 comprising a boss generally designated 138 having a channel opening 131 in which a latching arm 132 is pivotally mounted on a pivotal axis pin 133 affixed thru the sides 134, 135 of the boss. Arm 132 extends generally laterally of the bushing and is formed with a mass 136. A shoulder 137 is provided on the arm for engaging a dog such as 68 shown in FIG. 4 when the crankshaft is rotated and the centrifugal force thus produced moves arm 132 upwardly from its non-latching position of FIG. 4E. In this embodiment, another such stabilizing means 138 may be provided on the opposite top portion of the bushing to also stabilize the junction(s) at that end point.

Referring to FIG. 5 that stabilizing structure comprises a close mating cavity 96 and plunger 98. During compressor operation, cavity 96 is typically flooded with compressor oil, and when the dog-stop junction is formed, an oil seal exists around plunger 98. Thus when a destabilizing force acts on the cam tending to pull the plunger from the cavity, a pressure differential is developed across the plunger tending to force it back into the cavity. When, however, motor reversal occurs, the initial inertia of the cam and the acceleration of the crankshaft suffice to pull the plunger from the cavity and disrupt the junction.

Referring to FIG. 6, the stabilizing structure of FIG. 5 may be modified by opening the inner end of cavity 96 to ambient crankcase conditions by cut-out 100 and by affixing a check valve such as the thin, highly flexible flap valve 102 to the skirt by pin 104 or the like. This valve which is flexibly biased toward its closed position allows plunger 98 to easily insert into cavity 96 during the junction making by springing open in response to small hydraulic force, but when closed maintains said pressure differential and prevents inopportune withdrawal of the plunger.

Figure 7:
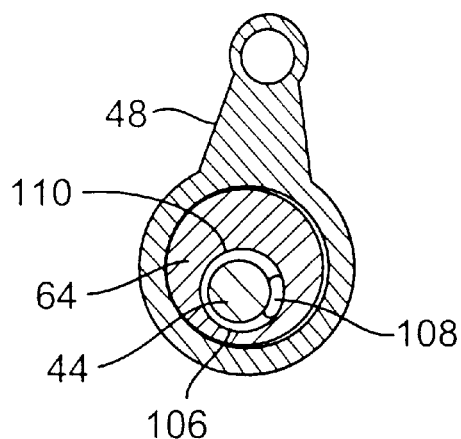
FIG. 7 is a cross-sectional view taken along line 4—4 of FIG. 2 and showing the crankpin journal surface provided with a groove and O-ring in sliding contact with the cam bearing surface.

In FIG. 7, the stabilizing structure comprises an O-ring 106 secured in an annular groove 108 in the crankpin shaft journal surface and frictionally engaging the bearing surface 110 of the cam. This O-ring can be dimensioned with respect to the journal and cam to provide a drag which cannot be readily overcome by most of the destabilizing forces.

Figure 8:
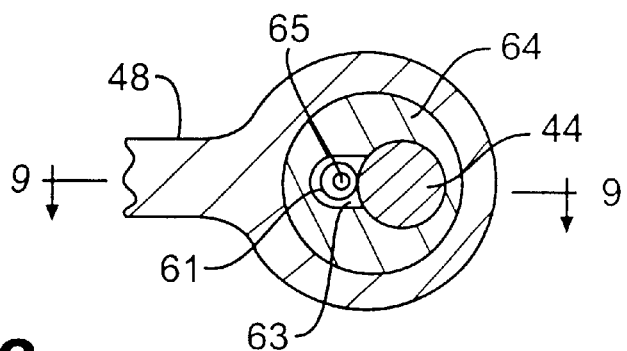
FIG. 8 is a cross-sectional view of the bearing journal area taken along line 4—4 of FIG. 2 in the direction of the arrows and showing a mechanical means, i.e., a pressure roller for developing friction drag and tending to maintain said junction(s)
Figure 9:
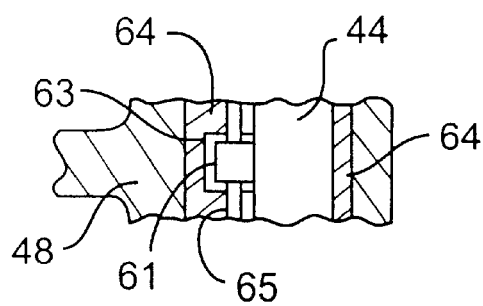
FIG. 9 is a cross-sectional view taken along line 9—9 of FIG. 8 further showing the mountings for the roller of FIG. 13.

Referring to FIGS. 8 and 9, the frictional drag is provided by a roller 61, preferably of semi-hard plastic such as Nylon, Teflon, or the like, rotatably mounted in a recess 63 formed in the body of cam 64, by shaft 65. This roller also may be dimensioned to provide practically any desired stabilizing force.

Figure 10:
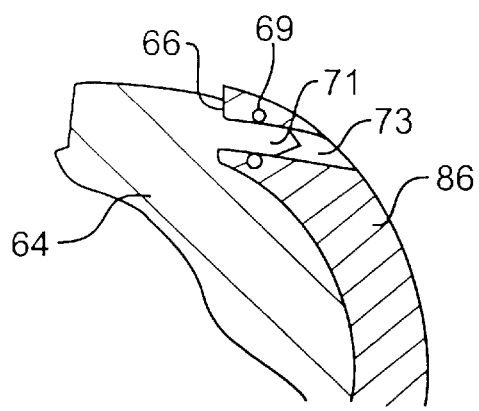
FIG. 10 is a view as in FIG. 5 showing a friction drag stabilizing structure.

In FIG. 10 a variation of the pressure differential stabilizing structure of FIG. 5 is shown, and provides a desired friction drag by means of an O-ring 69 frictionally surrounding a plunger 71 in a thru bore 73 provided in skirt 86.

Figure 11:
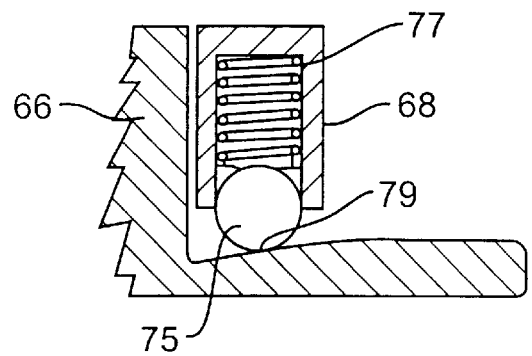
FIG. 11 is a variation of the friction drag means.

In FIG. 11 the frictional drag is provided by means of a ball 75 and compression spring 77 mounted in dog 68 and wherein a ramp 79 is provided on the crankshaft adjacent the stop. As the junction is made, the ball is cammed or forced down the ramp 79 towards the stop by the action of the ramp and spring. This camming force maintains the junction against at least some of the destabilizing forces.

It is particularly noted that all of the embodiments of the stabilizing structure of FIGS. 4–11 can also be employed to stabilize the junction at stop 67. Also, should it be desirable for a particular compressor, the stops 66, 67 may be angularly displaced at more or less than the approximate 180° as shown since these stabilizing structures are operable for any angular displacement.

Referring to FIGS. 12–22, these stabilizing structures are designated to help regulate the pressures in the compressions chambers of active cylinders as well as in completely pacified or partially pacified cylinders.

Figure 12:
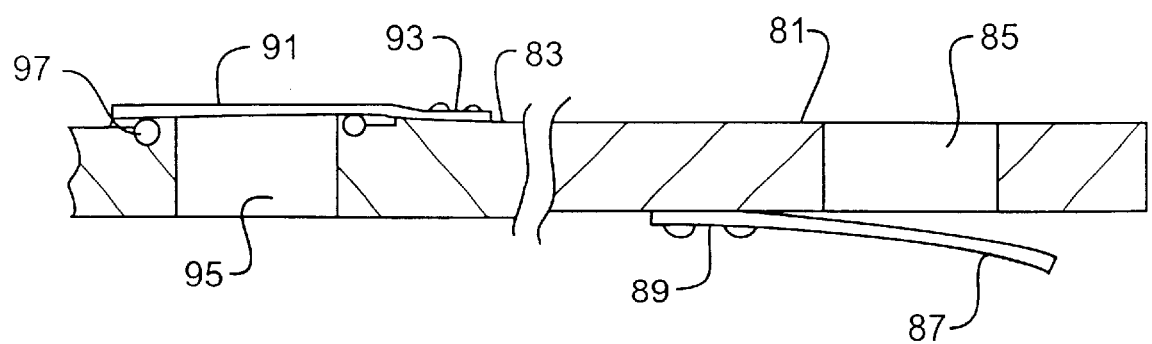
FIG. 12 is a cross-sectional view of a portion of the valve plate of FIG. 1 showing a sprung reed-type suction valve and special discharge valve.

In FIG. 12 is shown a valve plate having a suction section 81 and a discharge section 83. In the suction section having suction port 85, a reed-type suction valve 87 is shown affixed at one end 89 to the plate in known manner. This valve is lightly sprung to an open position as shown, whereby when the piston is in a completely pacified condition, any high pressure refrigerant leakage past the discharge valve into the compression chamber which could present a destabilizing force will be let down into the low pressure section of the compressor thru the suction valve. This suction valve is sprung open with only a light force, e.g., 5–10 ounces, such that it will close readily upon reactivation of the cylinder.

In FIG. 12, a discharge valve 91 is affixed to the plate at one end 93 and functions to seal and open discharge port 95. This particular discharge valve is designed to be essentially non-leaking by virtue of an O-ring 97 mounted in an annular groove formed in the valve plate and surrounding the discharge port. Such a valve greatly assists in diminishing the development of incidental pressure in the compression chamber of a completely pacified cylinder.

Figure 13:
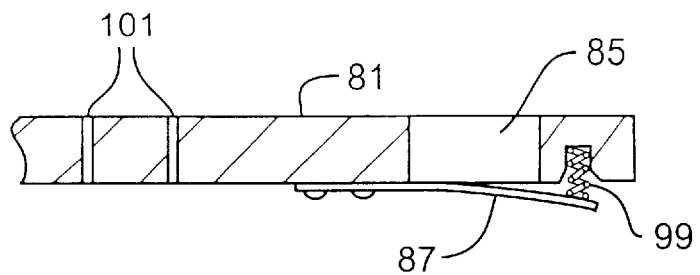
FIG. 13 is a view as in FIG. 12 showing the use of a positive pressure applicator means for resiliently urging a normally closed reed valve to a slightly open position and showing pressure let down apertures thru the suction of the valve plate.

In FIG. 13, the valve 87 is shown biased to an open position by means of a very light compression spring 99 mounted in the plate. Also shown in this figure are alternative or complementary stabilizing means, particularly for a pacified cylinder, of one or more small bleed apertures 101, e.g., 10–20 microns in diameter, formed in the suction section of the valve plate and communicating with the low side of the compressor.

Figure 14:
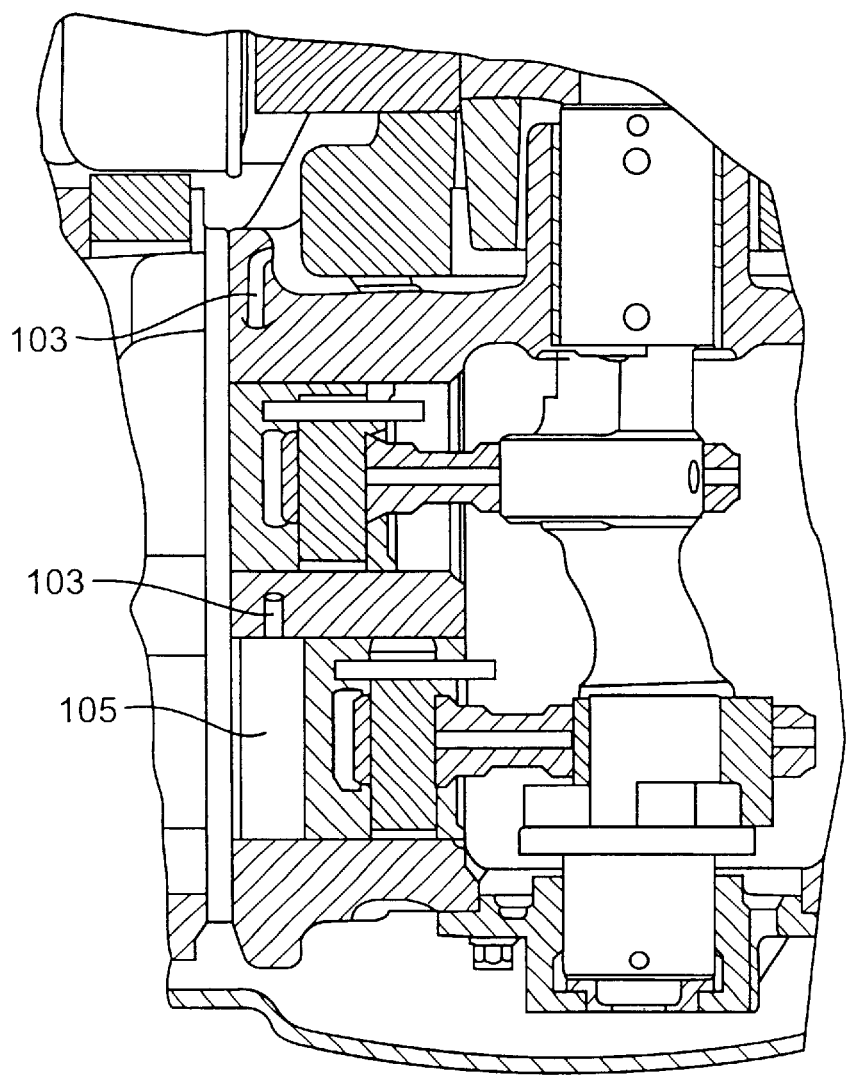
FIG. 14 is a view as in FIG. 1 of a portion of the compressor showing a pressure let-down aperture formed thru the cylinder wall and communicating thru conduit means provided in the cylinder block with the low pressure side of the compressor at a location removed from the dense gas-oil area of the crankcase.

In FIG. 14, a pressure let-down conduit or passage 103 is provided either externally of the block or formed internally therethrough as indicated, which communicates with the compression chamber 105 and extends upwardly to an outlet communicating with the low side at a position removed from the heavy oil-refrigerant mix.

Figure 15:
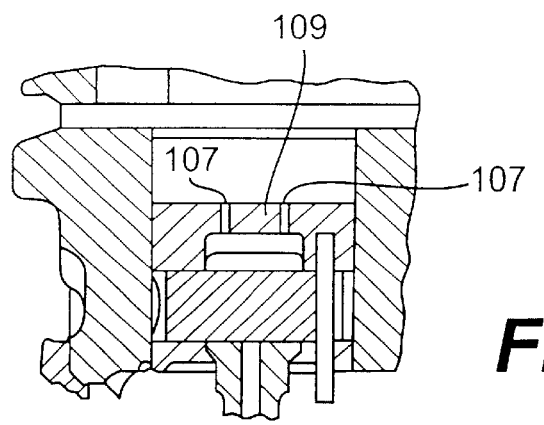
FIG. 15 is a cross-sectional of a switchable piston having one or more small diameter pressure let-down holes thru its top.

In FIG. 15 one or more small bleed apertures 107, identical, e.g., to 101 are formed thru the top or head 109 of the piston and communicate with the low side.

Figure 16:
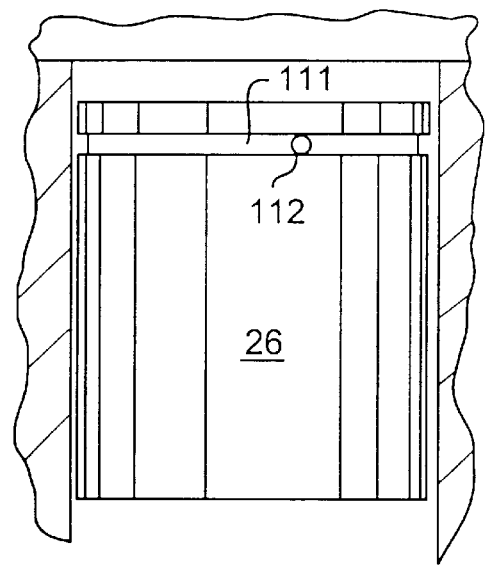
FIG. 16 is a cross-sectional view of a crankcase portion with a modified piston shown in relief.

In FIG. 16, the piston 26 is provided with an annular oil groove 111 which communicates thru an oil feed hole 112 which connects into the oil channels or passages of the crankshaft and connecting rod which feed the bearings and wrist pins thru a conventional pumping action. During active piston operation the pumping action feeds groove 111 under pressure and the oil forms a seal between the piston and the cylinder wall which substantially prevents the flow of high pressure refrigerant to the low side. When the piston is passive however, the gap 113 between the piston and cylinder wall is not sealed and thus allows any incidental pressure in the compression chamber to let down to the low side.

Figure 17:
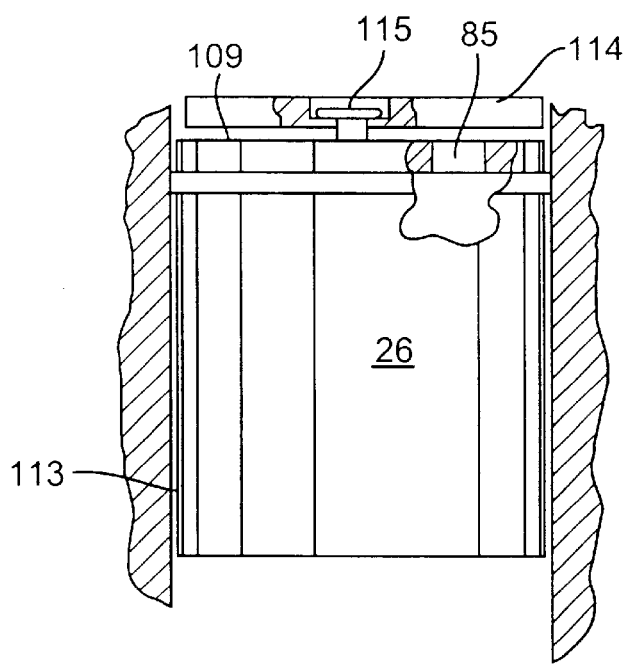
FIG. 17 is a view as in FIG. 6, with portions broken away and showing a piston having a floating suction valve.

In FIG. 17, the pressure let down is achieved by employing a suction valve which has an essentially free-floating disc 114 which is loosely held on the piston head by a retainer member such as 115. This disc is shown in its wide open position such as would exist on a normal suction stroke whereby suction port 116 which is in communication with the low side suction gas is wide open. In a passive condition of the cylinder when the suction disc is simply lying on the top 109 of the piston without experiencing any significant sealing gas pressure, the disc and valve port in the piston head do not form a good gas seal, and any incidental pressure forming in the compression chamber can readily let down past this disc into the low side. A working example of this embodiment is given below.

Figure 18:
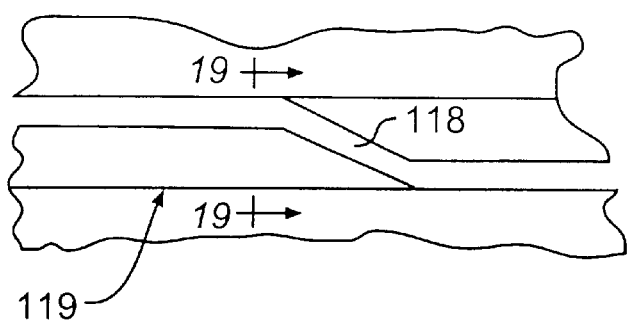
FIG. 18 is a side view of a portion of a piston showing a special spring compression ring and groove construction in a leaking suction mode.
Figure 19:
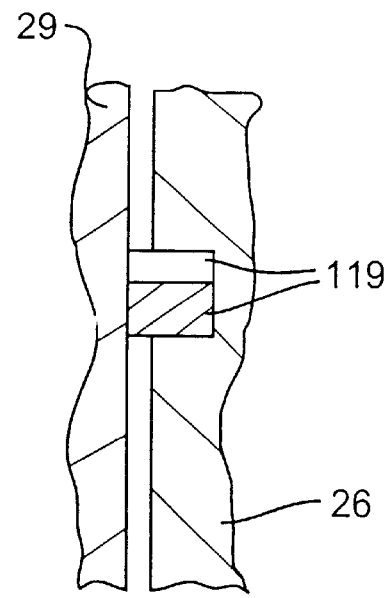
FIG. 19 is a cross-sectional view taken along line 19—19 of FIG. 18.
Figure 20:
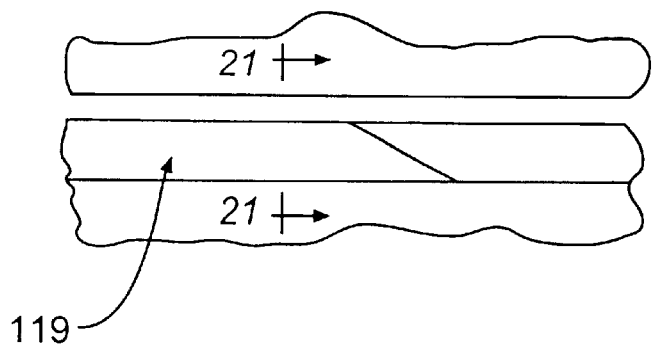
FIG. 20 is a view as in FIG. 18 showing the ring in a sealing compression mode.
Figure 21:
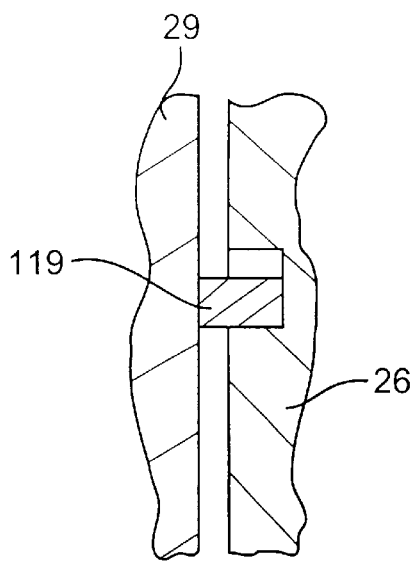
FIG. 21 is a cross-sectional view taken along line 21—21 of FIG. 20.

Referring to FIGS. 18–21, the incidental pressure let down is thru the gap 118 formed between the ends of a twisted or cocked piston ring 119. The ring in its unpressured and leaking condition is as shown in FIGS. 18 and 19, and in its pressured and sealing condition, as on a normal compression stroke, is as shown in FIGS. 20 and 21.

Figure 24:
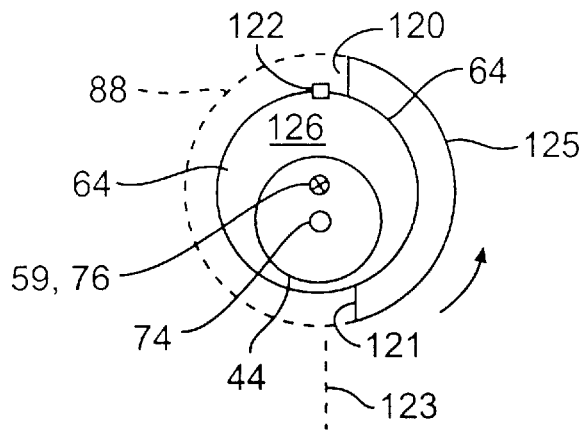
FIG. 24 is a top view of the cam of FIG. 22.

A most preferred embodiment of the cam dog and crankshaft stop construction are shown in FIGS. 22–27 wherein in FIG. 24 the crankshaft is rotating counterclockwise and the cam is in its pacifying position. In this embodiment, the bushing 88 carries a single stop 119 and the cam 64 carries a pair of dogs 120 and 121, and wherein the dogs and stops are positioned such that the apex 122 of the cam will lie substantially in the orbital plane 123 of the crankpin at each dog or end point 120 and 121 of the cam rotation. It is noted that orbital plane 123 is defined by the crankpin shaft center axis 74 and the rotational axis 76 of the crankshaft. This construction provides for selected full or zero piston stroke.

Figure 28:
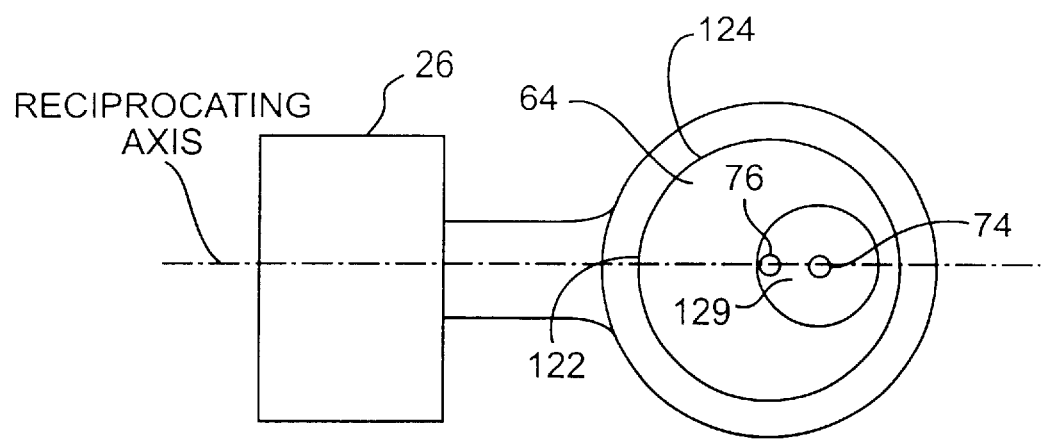
FIG. 28 is a further explanatory view of a pacified piston.
Figure 29:
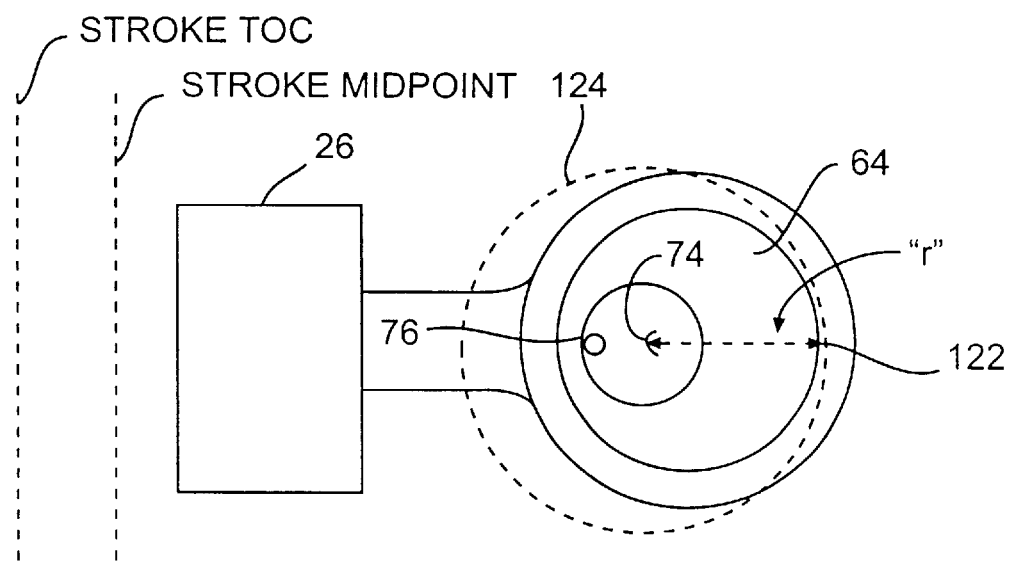
FIG. 29 is a further explanatory view of the piston of FIG. 28 in a fully active, i.e., full stroke mode.

The relative angular orientations of the crankpin, cam and crankshaft at the two end points are given in FIGS. 28 and 29 wherein the cam is dimensioned such that in its proximal or pacifying orientation of FIG. 28 the orbit 124 of the crankpin (i.e., crankpin shaft 129+cam 64) is concentric with the crankshaft axis 76. Conversely, in the fully operational orientation of the cam as in FIG. 29 the orbit 124 of the crankpin is at its maximum radius "r".

In this embodiment the stabilizing structure comprises a mass 125 added to the cam body 126, wherein the stops 120 and 121 or end points are provided on the mass. This added mass shifts the center of gravity (CG) of the cam as shown e.g., in FIG. 3 from its approximate position as shown therein to the approximate new position shown in FIG. 22. This new CG position which is offset, i.e., in advance of, the aforesaid orbital plane 123 which passes thru the crankshaft axis and the crankpin axis will generate a CFT tending to maintain the junction(s) against the aforementioned destabilizing forces. This modified cam structure, thru proper design of its configuration and weight distribution, cam be tuned to produce any desired CFT, e.g., from about 10 to about 50 in lbs at a conventional crankshaft rotational speed of 3600 rpm. Such a CFT will substantially, if not totally, offset the destabilizing forces generated during active piston reciprocation.

The above weighted cam can be effective by itself to diminish a substantial portion of the destabilizing forces for many compressor constructions and operating parameters. However, it has been found that in situations where a zero piston stroke mode is attempted, some additional stabilizing means is necessary, particularly in view of the space limitations imposed upon the structure and the allowable dimensions of the crankpin and connecting rod bearing, and upon the allowable dimensions of the connecting rod oscillations, by the structural confines of the compressor crankcase.

Thus, one or a combination of the stabilizing structures of the present invention as defined above and further below can be used very effectively, particularly in combination with the above described weighted cam to provide a substantially comprehensive stabilizing structure.

The present invention includes the method of stabilizing a compressor throw adjusting cam of a compressor having a complex crankpin journal, against destabilizing forces, wherein said cam forms part of said journal and is angularly adjustable about the shaft of said crankpin between angularly spaced end points which are delineated and established as junction(s) by structural stop and dog means of the crankshaft and cam respectively, and wherein said destabilizing forces comprise refrigerant pressure differentials and mechanical inertial forces acting on the piston associated with said crankpin throw, said method comprising counteracting said destabilizing forces by a combination of centrifugal force torque forces generated by said cam and tending to maintain said junction(s), and by pressure let down means tending to reduce said pressure differentials.

The Examples I and II below will further illustrate preferred embodiments of the present invention.

EXAMPLE I

Figure 22:
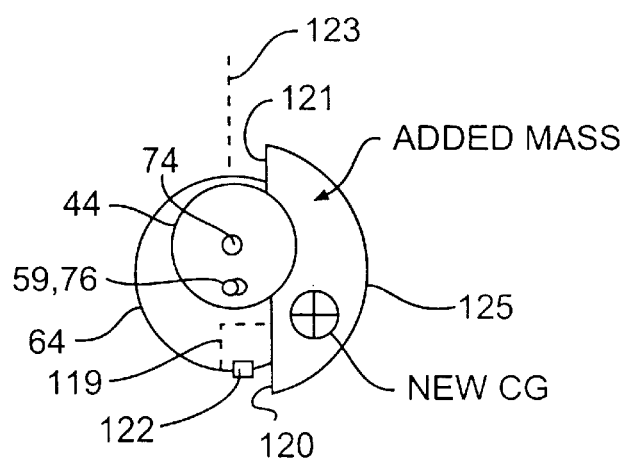
FIG. 22 is a bottom view of a preferred weighted, double stop cam for developing CFT for stabilizing the junction(s)
Figure 23:
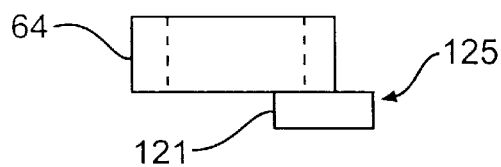
FIG. 23 is a side view of the cam of FIG. 22 rotated 90° thru the plane of the drawing paper.

A preferred embodiment of the stabilizing means or structure of the present invention, as best known at this time, and typical, but by no means limiting, structural, dimensional, and operating parameters therefor is given below as a best mode example in the context of a dual piston refrigeration compressor of about 40,000 Btu/hr capacity. The compressor has a volumetric capacity shiftable cylinder #1 and non-variable volumetric capacity cylinder #2, wherein the crankpin throw of cylinder #1 is shiftable from a zero piston stroke position to a full piston stroke position, and vice-versa. In this example, the stabilizing structure comprises a free-floating suction valve disc of the general types shown, e.g., in FIGS. 17 and 32–34, and in the aforementioned U.S. patents: U.S. Pat. Nos. 5,080,130; 5,106,278; and 5,203,857, in combination with a CFT generated by the weighted cam as shown in FIG. 22. The weight of the valve disc in this example is negligible and does not factor into the calculation of the Coefficient-Of-Leakage (COL). Also, this COL is independent of the areas and configurations of the actual contact or sealing surfaces between the disc and suction port, as well as the materials of construction of said surfaces and represents an extremely coherent design tool.

(1) maximum volumetric capacity of shiftable cylinder #1—(3.5 in$^3$);

(2) non-variable volumetric capacity of cylinder #2—(3.5 in$^3$);

(3) normal operation pressure range in shiftable cylinder #1 in its fully active mode—(77 to +297 Psig);

(4) normal operating pressure range in cylinder #2 in its fully active mode—(77 to 297 Psig);

(5) experienced pressure range in shiftable cylinder #1 during normal compressor operation of piston #2, and with piston #1 in its substantially fully passive mode, i.e., wherein the #1 piston moves less than about 10% in either direction beyond the mid-point of its fully active stroke—(0 to 40 Psig);

(6) COL* (0.2, preferably ranging from about 0.03 to about 0.5 and most preferably from about 0.5 to about 0.35);

(7) CFT generated by cam at crankshaft speed of 3600 rpm—(10.0 in lb to about 20.0 in lb);

(8) maximum crankpin throw radius for piston #1—0.550 in;

(9) maximum crankpin throw radius for piston #2—0.550 in;

(10) top surface of suction valve disc—about 2.0 to 2.5 in$^2$;

*This coefficient is the ratio of the sealing pressure on the suction valve disc structure to the refrigerant leakage flow rate thru the suction valve, wherein said sealing pressure is equal to the total pressure on the compression side, i.e., the entire top surface of the valve disc, in lb, and wherein the leakage flow rate is in in$^3$ per minute of refrigerant leaking past the substantially closed or semi-closed suction valve at a constant pressure differential across the suction valve, i.e., between the idle compression chamber and the low side, of 20 Psig at a temperature of 20° C. This coefficient, in terms of its units would be, $$COL = \frac{\text{lb} \cdot \text{min}}{\text{in}^3}.$$

Figure 37:
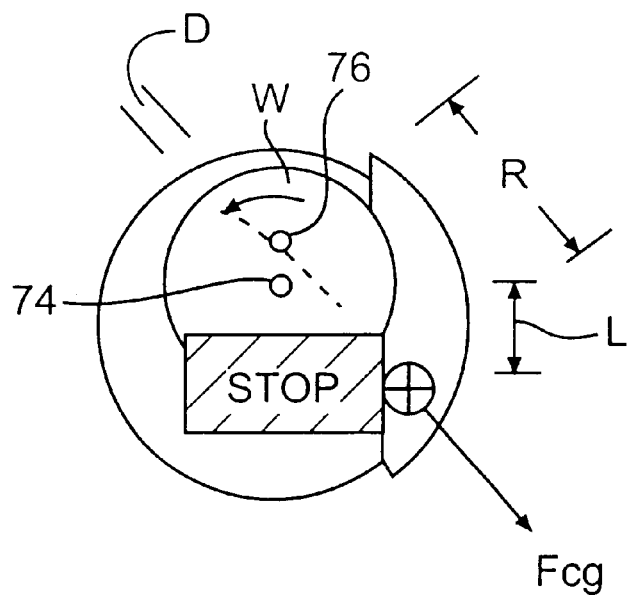
FIG. 37 is a view similar to FIG. 22 and showing how the desired CFT is calculated for a fully active piston.
Figure 38:
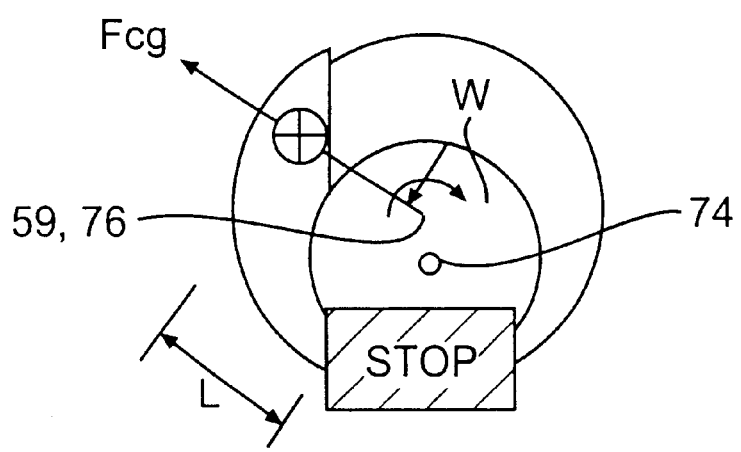
FIG. 38 is a view similar to FIG. 37 but showing the cam in its pacifying orientation, and the calculation for the desired CFT.

Centrifugal Force Torque (CFT) Calculation—See FIGS. 37 & 38 m=mass of cam=0.3 lb-in.

W=rotational velocity of crankshaft.

=3600 rpm=377 radians/second (there are 2 pi radians per revolution of the cranshaft).

R=distance between the rotational axis of the crankshaft and the cam center of gravity=0.500 in.

$$gc = \text{gravity constant} = 386.4 \frac{\text{lbm} \cdot \text{in}}{\text{lbf} \cdot \text{sec}^2}$$

wherein lbm=pound mass and lbf=pound force.

$$\text{rotation} = Fcg = \frac{m \, w^2 R}{gc} = \frac{0.3(377)^2(0.5)}{386.4} = 55.18 \text{ lbf}$$

Fcg.D=Resulting centrifugal force to (CFT) around center torque crankpin shaft.

D=perpendicular distance between the center axis 74 of the crankpin shaft and the Fcg line of action, i.e., the line passing thru the rotational axis of the crankshaft and the cg of the cam.

$$CFT = 55.18 \, lbf (0.120 \text{ in}) = 6.90 \text{ in} \cdot \text{lbf}$$

$$\text{Contact force between stop and dog} = F = \frac{CFT}{L}$$

L=distance from center axis 74 of crankpin shaft to center of contact between the dog and stop=0.500 in $$Fs = \frac{6.90}{0.50} = 13.8 \text{ lbf}$$

Figure 30:
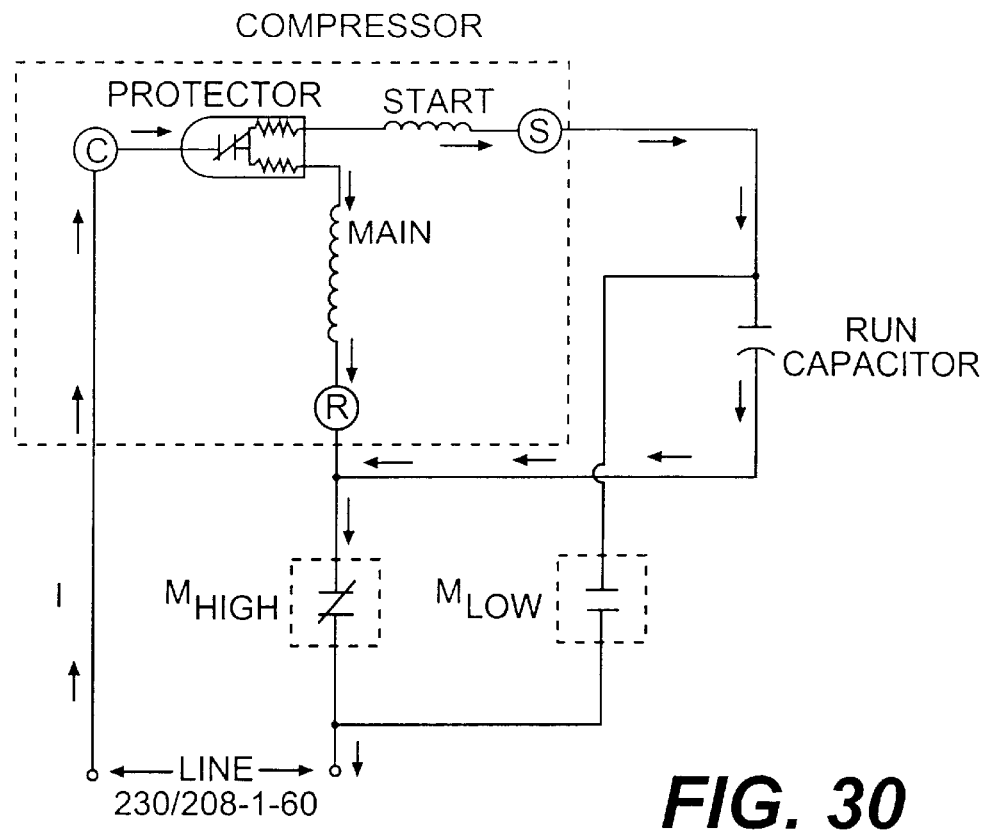
FIG. 30 is an electrical schematic of a preferred motor circuit for two piston full operations.

As mentioned above, a unique electrical circuit has been developed for controlling the reversible motor and may be employed in the preferred embodiment of the invention as described in Example I below, the circuit being shown schematically in FIGS. 30 and 31.

The TS, i.e., "twin-single" connotation, meaning two or one piston operation. The Control Schematic of FIG. 30 is equivalent to industry conventional PSC (permanent, split capacitor) wiring schematics using predetermined power supply. Line I runs through the common terminal (C) which leads into the motor protection. After leaving the motor protection the current flow will split, going through both the Start (S) and Main, i.e., Run (R) windings with M (motor) High contactor closed. This stage will be using the Run winding as the Main winding and places the Run capacitor in series with the Start winding, obtaining standard motor rotation with two pistons fully active.

Figure 31:
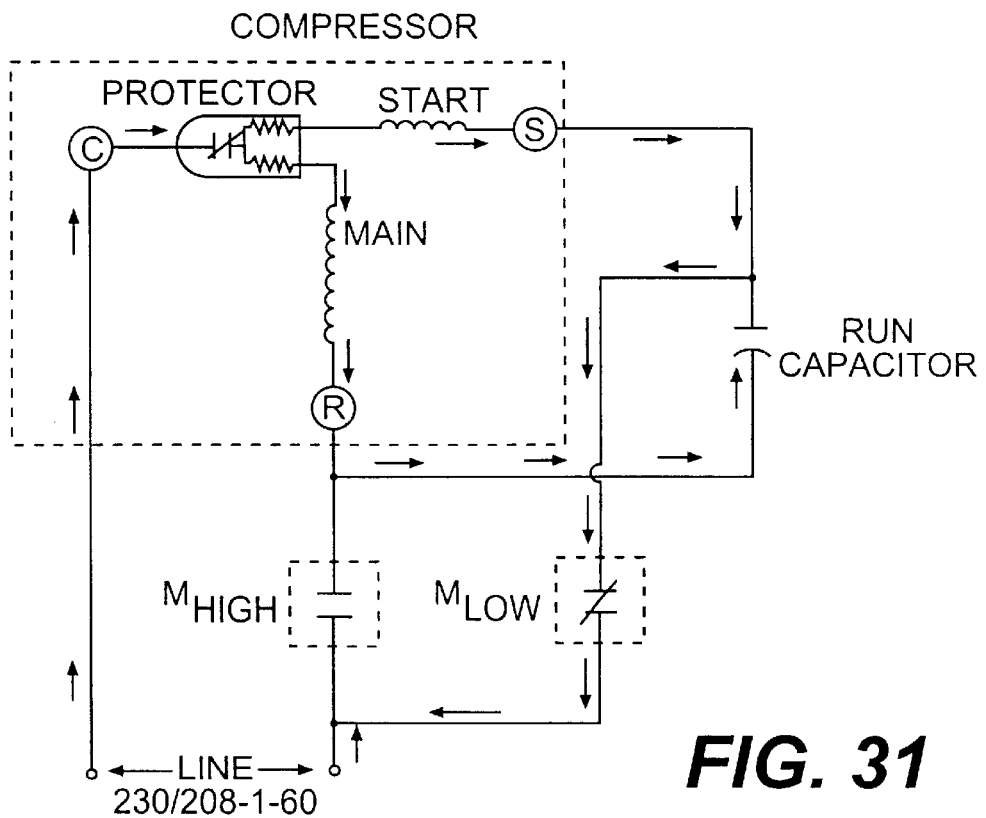
FIG. 31 is an electrical schematic of the circuit of FIG. 30 for one piston full operation.

The present unique TS Control Schematic of FIG. 31 employs a predetermined power supply depending on application. Line one will run through the common terminal (C), which leads to the motor protection. After leaving the motor protection, the current flow separates going through both the Start and Main windings with M low contactor energized. The TS will now be using the Start winding as the Main and placing the Run capacitor in series with the original Main winding. Run capacitor placement in this mode facilitates both motor and mechanical rotation changes and simultaneously reduces motor strength to match the resulting reduced or eliminated piston stroke, thus maximizing motor efficiency for the reduced load.

EXAMPLE II

This example of the present unique circuit, as best known at this time for use with the compressor of Example I, employs the following structures and operating parameters Motor (reversible) 3–4 hp.

Protector—Protects against overload in both load modes. Senses both T° and current.

Power Supply—Single or three phase of any frequency or voltage, e.g., 230 V-60 $H_z$ single phase, or 460 V-60 $H_z$ three phase.

Switching Mechanism—control circuit which is responsive to load requirements to place the Run Capacitor in series with either the Start winding or Main winding, depending on the load requirements.

Figure 32:
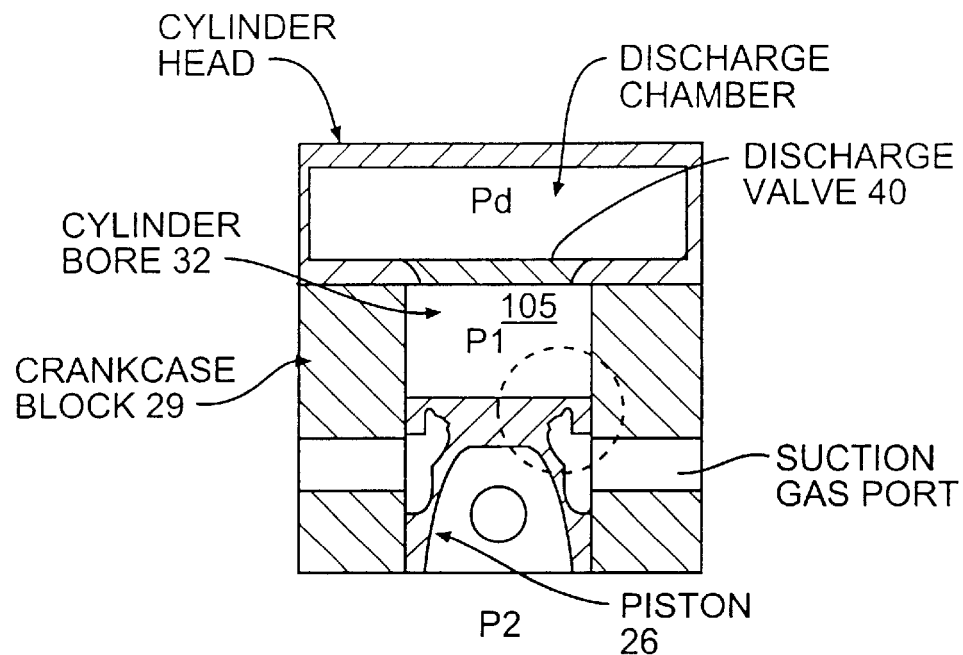
FIG. 32 is a cross-sectional view of a cylinder, piston and head structure illustrating the configuration of the pressure let down suction valve disc on FIGS. 1 and 2 on the compression stroke.
Figure 33:
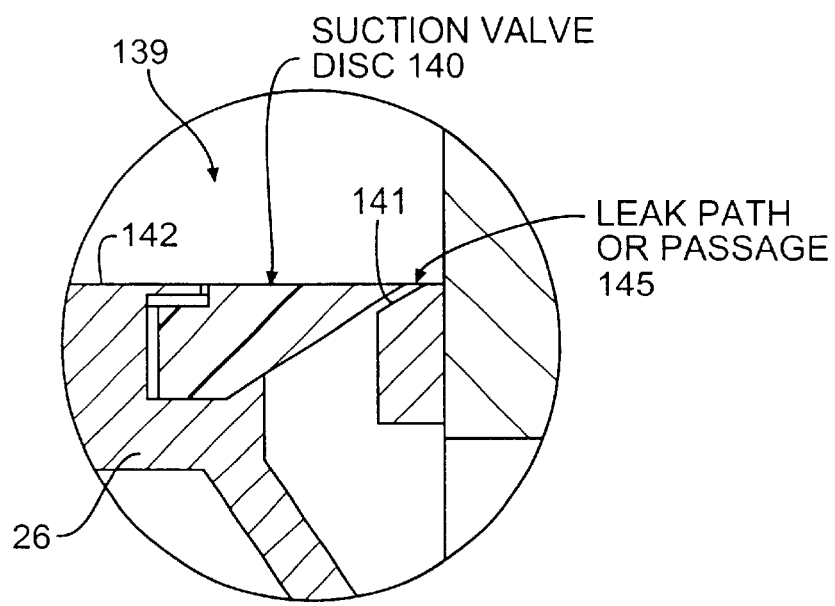
FIG. 33 is an enlarged view of the encircled portion of the suction valve of FIG. 32 illustrating the configuration of said valve disc during pacified cylinder operation.
Figure 34:
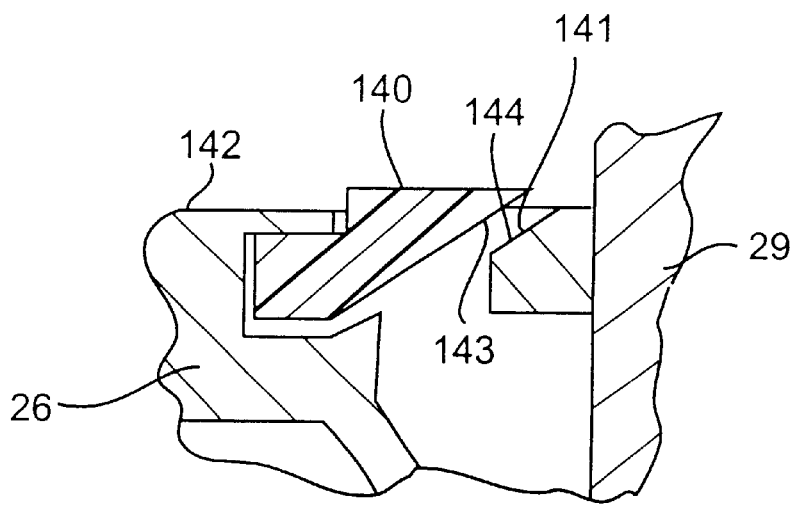
FIG. 34 is a view as in FIG. 33 showing the valve disc position on the suction stroke.
Figure 35:
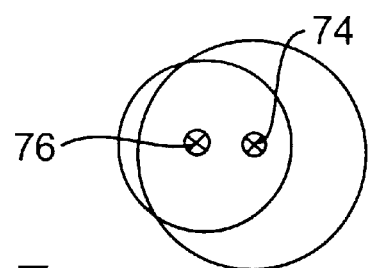
FIG. 35 is a view similar to FIG. 3, but showing throw data for conventional cylinder.
Figure 36:
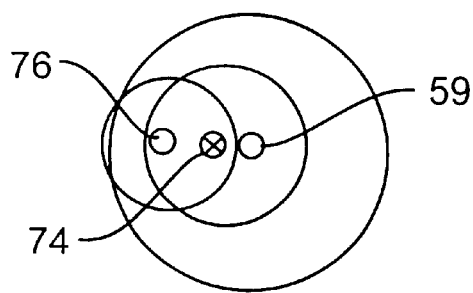
FIG. 36 is a view similar to FIG. 35, but showing throw data for one preferred adjustable throw cylinder in accordance with the present invention.

Referring particularly to FIGS. 32–34 and with reference to claims 19–24, a highly preferred pressure regulating means comprises a suction valve structure generally designated 139 having a free-floating valve disc 140 and a suction port seat 141, wherein said disc is comprised of resilient, pressure deformable material and is mounted in the piston head 142 such that a sealing face 143 of said disc is normally slightly spaced from a cooperating sealing face 144 of said seat to provide a pressure let-down passage 145, said disc being deformable by the pressure in the compression chamber 105 on the compression stroke whereby said faces which are preferably annular contact each other and form a compression seal.

The disc 140 is pressure deformable, semi-rigid, highly resilient and comprised of material selected from one or a blend of polyamide, polyimide, poly(amide-imide), polycarbonate, polystyrene, polytetrafluoroethylene, cellulose ester, polyester, vinyl polymers, polyolefin, or copolymers thereof.

The leak path 145 can range in width, i.e., the distance between the two faces 143, 144, from e.g., about 0.001 in. to about 0.02 in. or more, depending on the COL desired and the materials of construction of the disc.

The invention has been described in detail with particular reference to preferred embodiments thereof, but it will be understood that variations and modifications will be effected with the spirit and scope of the invention.

We claim:

1. A reciprocating piston compressor comprising:
    at least one cylinder;
    a reciprocable piston disposed in said cylinder;
    a crankshaft rotatable in both a forward and a reverse direction, said crankshaft having a cylindrical eccentric portion; and
    a cam disposed about said eccentric portion, said piston operatively connected to said cam, said cam rotatable about said eccentric portion between a first position corresponding to a first piston stroke length during forward rotation of said crankshaft, and a second position corresponding to a second piston stroke length during reverse rotation of said crankshaft;
    wherein, in one of said first and second positions, said cam is rotatably locked to said eccentric portion.

2. The compressor of claim 1, wherein said cam is rotatably locked to said eccentric portion by means of a pin.

3. The compressor of claim 1, wherein said cam is provided with a recess into which an extendable member is received.

4. The compressor of claim 3, wherein said cam recess is provided with a spring, said spring biasing said member into a recess in said eccentric and out of said cam recess.

5. The compressor of claim 1, wherein said cam comprises at least one counterweight portion.

6. The compressor of claim 5, wherein said counterweight portion comprises having first and second driven faces, and said crankshaft comprises a flange having first and second driving faces, said first driven face and said first driving face abutting in said first position, said second driven face and said second driving face abutting in said second position.

7. The compressor of claim 1, wherein said cam is unitary, said crankshaft comprising a plurality of interconnected crankshaft pieces.

8. The compressor of claim 1, wherein said cam comprises a plurality of pieces, said cam pieces interfitted about said eccentric portion.

9. The compressor of claim 1, wherein said first and second piston stroke lengths are different.

10. The compressor of claim 9, wherein one of said first and second piston stroke lengths is zero.

11. A reciprocating piston compressor comprising:
    at least one cylinder;
    a reciprocable piston disposed in said cylinder;
    a crankshaft rotatable in a forward and a reverse direction, said crankshaft having a cylindrical eccentric portion;
    a cam disposed about said eccentric portion, said piston operatively connected to said cam, said cam rotatable about said eccentric portion between a first position corresponding to a first piston stroke length during forward rotation of said crankshaft, and a second position corresponding to a second piston stroke length during reverse rotation of said crankshaft; and
    means for locking said cam with said eccentric portion in one of said first and second positions.

\* \* \* \* \*